(12) United States Patent
Ishikawa et al.

(10) Patent No.: US 7,935,944 B2
(45) Date of Patent: May 3, 2011

(54) ION BEAM IRRADIATING APPARATUS, AND METHOD OF PRODUCING SEMICONDUCTOR DEVICE

(75) Inventors: Junzo Ishikawa, Kyoto (JP); Dan Nicolaescu, Kyoto (JP); Yasuhito Gotoh, Kyoto (JP); Shigeki Sakai, Kyoto (JP)

(73) Assignees: Kyoto University, Kyoto (JP); Nissin Ion Equipment Co., Ltd., Kyoto (JP)

( * ) Notice: Subject to any disclaimer, the term of this patent is extended or adjusted under 35 U.S.C. 154(b) by 77 days.

(21) Appl. No.: 12/304,241

(22) PCT Filed: Jun. 12, 2007

(86) PCT No.: PCT/JP2007/062200
§ 371 (c)(1),
(2), (4) Date: Dec. 10, 2008

(87) PCT Pub. No.: WO2007/145355
PCT Pub. Date: Dec. 21, 2007

(65) Prior Publication Data
US 2009/0203199 A1 Aug. 13, 2009

(30) Foreign Application Priority Data
Jun. 12, 2006 (JP) .................. 2006-162394

(51) Int. Cl.
*G21G 1/10* (2006.01)
(52) U.S. Cl. ............ 250/492.3; 250/492.1; 250/492.2; 250/492.21; 250/251

(58) Field of Classification Search ............... 250/492.1, 250/492.2, 492.21, 492.3, 251
See application file for complete search history.

(56) References Cited

U.S. PATENT DOCUMENTS

| | | | | |
|---|---|---|---|---|
| 4,939,360 A | * | 7/1990 | Sakai | 250/251 |
| 5,136,171 A | * | 8/1992 | Leung et al. | 250/492.2 |
| 6,762,423 B2 | * | 7/2004 | Liebert et al. | 250/492.21 |
| 2004/0031935 A1 | * | 2/2004 | Nishigami | 250/492.21 |
| 2004/0084635 A1 | * | 5/2004 | Liebert et al. | 250/492.21 |
| 2005/0133735 A1 | * | 6/2005 | Tatsumi et al. | 250/492.3 |

FOREIGN PATENT DOCUMENTS

| | | | |
|---|---|---|---|
| JP | 04 143272 A | | 5/1992 |
| JP | 04143272 A | * | 5/1992 |
| JP | 2005-26189 | * | 1/2005 |

(Continued)

OTHER PUBLICATIONS

Japanese Office Action for Application No. 2006-162394, mailed on Jun. 17, 2009 (14 pages).

(Continued)

*Primary Examiner* — Robert Kim
*Assistant Examiner* — Michael Maskell
(74) *Attorney, Agent, or Firm* — Osha • Liang LLP

(57) ABSTRACT

An ion beam irradiating apparatus has a field emission electron source 10 which is disposed in a vicinity of a path of the ion beam 2, and which emits electrons 12. The field emission electron source 10 is placed in a direction along which an incident angle formed by the electrons 12 emitted from the electron source 10 and a direction parallel to the traveling direction of the ion beam 2 is in the range from −15 deg. to +45 deg. (an inward direction of the ion beam 2 is +, and an outward direction is −).

9 Claims, 14 Drawing Sheets

FOREIGN PATENT DOCUMENTS

| JP | 2005-26189 A | 1/2005 |
| JP | 2006-040821 | 2/2006 |
| JP | 2007-035370 A | 2/2007 |

OTHER PUBLICATIONS

Patent Abstracts of Japan for Japanese Publication No. 2006-134354, publication date May 25, 2006 (1 page).

Patent Abstracts of Japan for Japanese Publication No. 2006-040821, publication date Feb. 9, 2006 (1 page).

International Search Report from PCT/JP2007/062200 dated Jan. 16, 2003 (3 pages).

Written Opinion from PCT/JP2007/062200 dated Jan. 16, 2008 (3 pages).

* cited by examiner

ION BEAM IRRADIATING APPARATUS, AND METHOD OF PRODUCING SEMICONDUCTOR DEVICE

TECHNICAL FIELD

The present disclosure relates to an ion beam irradiating apparatus, which irradiates a target with an ion beam (in the specification, a positive ion beam) extracted from an ion source, thereby performing ion implantation or another process, and also to a method of producing a semiconductor device with using the apparatus. In the case where ion implantation is performed, the ion beam irradiating apparatus is also called an ion implanter.

BACKGROUND ART

In an ion beam irradiating apparatus which irradiates a target with an ion beam extracted from an ion source, thereby performing ion implantation or another process, it is desired to efficiently transport a low-energy and large-current ion beam from viewpoints such as that the throughput of the apparatus is improved, and that the ion implantation depth is reduced to cope with miniaturization of a semiconductor device to be formed on the target.

As the energy of an ion beam is lower and the current of the beam is larger, however, dispersion of the ion beam due to space charge is further increased, and hence it is difficult to efficiently transport the ion beam. As one technique for solving the problem, a technique is known in which electrons are supplied from the outside to a transported ion beam and space charge of the ion beam is neutralized by the electrons.

In this case, it is preferable to use an electron source which can generate a large amount of low-energy electrons because of reasons such as that negative charging of the surface of a target by the supplied electrons is suppressed.

As an electron source which can generate a large amount of low-energy electrons, Japanese Patent Unexamined Publication No. 2005-26189 (Paragraphs 0007 to 0009, FIG. 1) (hereinafter referred as Patent Reference 1) discloses a field emission electron source. Namely, the publication discloses a technique in which a field emission electron source that can generate a large amount of low-energy electrons is placed in the vicinity of a target, electrons emitted from the field emission electron source are caused to be incident substantially perpendicularly on an ion beam from the lateral side of the ion beam, and charging (charge-up) of the surface of the target at ion-beam irradiation is suppressed.

DISCLOSURE OF THE INVENTION

Although the charging suppression of a target surfaces disclosed in Patent Reference 1, and the neutralization of space charge of an ion beam are techniques for different objects, the inventors conceived that a field emission electron source such as disclosed in Patent Reference 1 is used in the neutralization of space charge of an ion beam, and researched the use.

However, it was noted that, even when, in the same manner as the technique disclosed in Patent Reference 1, electrons emitted from a field emission electron source are incident substantially perpendicularly on an ion beam from the lateral side of the ion beam, the effect of the neutralization of space charge of the ion beam is small, and hence suppression of dispersion of the ion beam is small.

This is caused because of the following reason. Even when electrons are incident as described above, most of the electrons are moved so as to pass through the ion beam or stride over the ion beam, by the kinetic energy of the electrons, and acceleration due to the positive beam potential of the ion beam. Therefore, the existence probability of the electrons in the ion beam is low. Accordingly, it is difficult to efficiently neutralize space charge of the ion beam.

Therefore, it is an object of the invention to provide an apparatus which uses a field emission electron source, and which can efficiently neutralize space charge of an ion beam and effectively suppress dispersion of the ion beam due to the space charge.

The ion beam irradiating apparatus of a first aspect of the invention comprises a field emission electron source which is disposed in a vicinity of a path of the ion beam, which emits electrons, and which has many minute emitters that are formed on a conductive cathode substrate, and that have a pointed shape, and extraction electrodes that surround respectively vicinities of tip ends of the emitters with forming a minute gap, and the field emission electron source is placed in a direction along which an incident angle formed by electrons emitted from the electron source 10 and a direction parallel to a traveling direction of the ion beam is in a range from −15 deg. to +45 deg. (an inward direction of the ion beam is +, and an outward direction is −).

When the field emission electron source is placed in the above-mentioned direction, and the incident angle of electrons emitted from the field emission electron source with respect to the ion beam is set to the above-mentioned range, the existence probability of the electrons in the ion beam is increased. As a result, space charge of the ion beam can be efficiently neutralized and dispersion of the ion beam due to the space charge can be effectively suppressed.

In a second aspect of the invention, the incident angle is preferably in a range from −15 deg. to +30 deg. More preferably, in a third aspect of the invention, the incident angle is in a range from substantially 0 deg. to +15 deg. Most preferably, in a fourth aspect of the invention, the incident angle is substantially 0 deg.

In a fifth aspect of the invention, the field emission electron source may be placed in a direction along which electrons are emitted toward a downstream side of the traveling direction of the ion beam. Alternatively, in the sixth aspect of the invention, the field emission electron source may be placed in a direction along which electrons are emitted toward an upstream side of the traveling direction of the ion beam.

The field emission electron source may be placed on one side of the path of the ion beam. Alternatively, in a seventh aspect of the invention, the field emission electron source may be placed on both sides of the path of the ion beam.

In an eighth aspect of the invention, in the case where, at the position of the field emission electron source, the ion beam has a shape in which a dimension of a Y direction in a plane intersecting with the traveling direction X is larger than a dimension of a Z direction perpendicular to the Y direction, preferably, the field emission electron source has a shape which extends in the Y direction.

In a ninth aspect of the invention, while the target is a semiconductor substrate, and the semiconductor substrate is irradiated with the ion beam by using the ion beam irradiating apparatus to perform ion implantation, plural semiconductor devices may be produced on the semiconductor substrate.

According to the first aspect of the invention, when the field emission electron source is placed in the above-mentioned direction, and the incident angle of electrons emitted from the field emission electron source with respect to the ion beam is set in the above-mentioned range, the existence probability of the electrons in the ion beam is increased. Therefore, space charge of the ion beam can be efficiently neutralized and dispersion of the ion beam due to the space charge can be effectively suppressed. As a result, the transport efficiency of the ion beam can be improved.

According to the second aspect of the invention, when the incident angle is set in the above-mentioned range, space charge of the ion beam is more efficiently neutralized by electrons emitted from the field emission electron source, and dispersion of the ion beam due to the space charge can be more effectively suppressed. As a result, the transport efficiency of the ion beam can be more improved.

According to the third aspect of the invention, when the incident angle is set in the above-mentioned range, space charge of the ion beam is further efficiently neutralized by electrons emitted from the field emission electron source, and dispersion of the ion beam due to the space charge can be further effectively suppressed. As a result, the transport efficiency of the ion beam can be further improved.

According to the fourth aspect of the invention, when the incident angle is substantially 0 deg., space charge of the ion beam is further efficiently neutralized by electrons emitted from the field emission electron source, and dispersion of the ion beam due to the space charge can be further effectively suppressed. As a result, the transport efficiency of the ion beam can be further improved.

According to the fifth aspect of the invention, when the field emission electron source is placed with being directed toward the downstream side, the field emission electron source can be placed with being separated upstream from the target, so that dispersion of the ion beam can be effectively suppressed over a long distance to the target.

According to the sixth aspect of the invention, when the field emission electron source is placed with being directed toward the upstream side, space charge of the ion beam can be efficiently neutralized by electrons emitted from the field emission electron source, and dispersion of the ion beam due to the space charge can be effectively suppressed. In addition, electrons emitted from the field emission electron source are hardly incident on the target. Therefore, a further effect that negative charging of the surface of the target by the electrons is suppressed is attained. This is particularly effective in the case where the energy of electrons emitted from the field emission electron source is not very low.

According to the seventh aspect of the invention, the field emission electron source is placed on both sides of the path of the ion beam, so that electrons can be supplied to the ion beam from the both sides of the ion beam. Therefore, space charge of the ion beam is further efficiently neutralized, and dispersion of the ion beam due to the space charge can be further effectively suppressed.

According to the eighth aspect of the invention, the field emission electron source has a shape which extends in the Y direction. Even when the ion beam has a shape extending in the Y direction through or not through scanning in the Y direction, therefore, space charge of the ion beam can be neutralized more efficiently over a wider range of the ion beam.

According to the ninth aspect of the invention, plural semiconductor devices can be produced on a semiconductor substrate by using an ion beam in which space charge is neutralized, and which is less dispersed. Therefore, plural semiconductor devices having uniform characteristics can be produced on the same semiconductor substrate. As a result, the yield is improved, and the production efficiency of a semiconductor device is enhanced.

DESCRIPTION OF REFERENCE NUMERALS AND SIGNS

Figure 1:
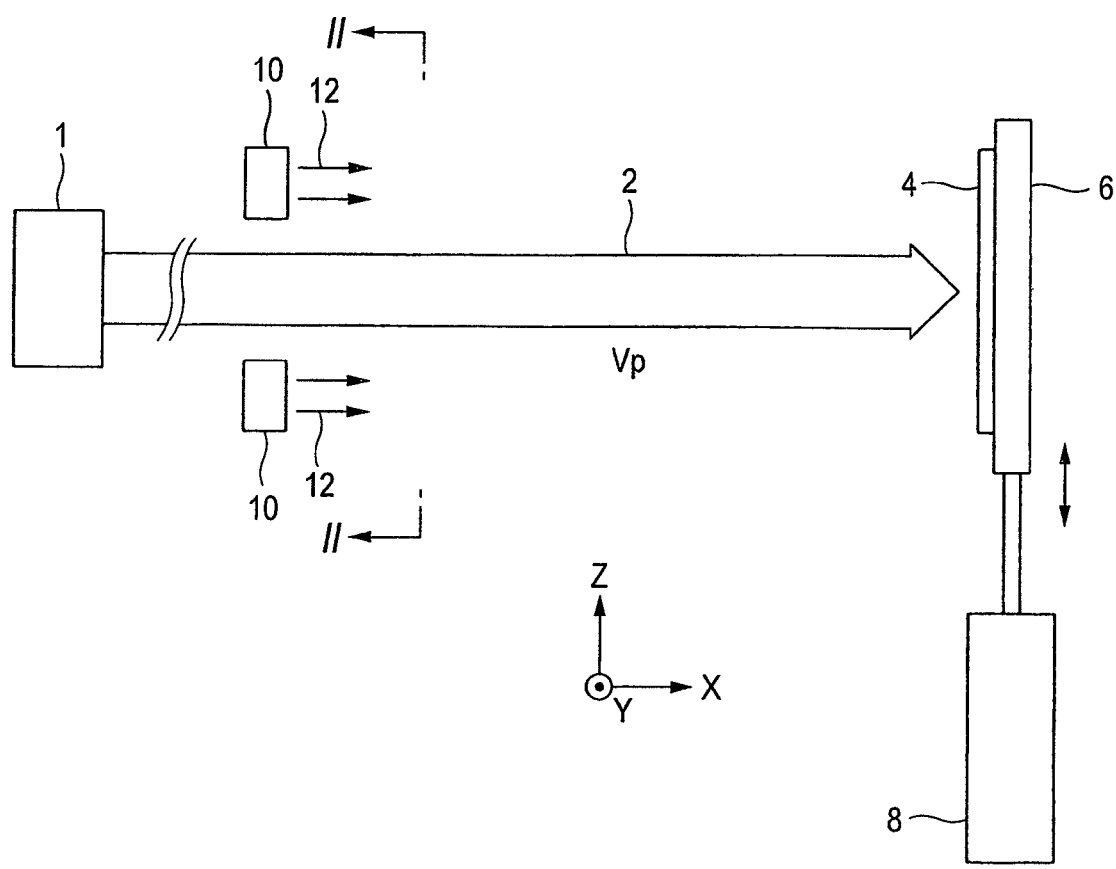
FIG. 1 is a schematic side view showing an embodiment of the ion beam irradiating apparatus of the invention.

1 ion source
2 ion beam
4 target
6 holder
10 field emission electron source
12 electron
16 cathode substrate
18 emitter
θ incident angle

BEST MODE FOR CARRYING OUT THE INVENTION

FIG. 1 is a schematic side view showing an embodiment of the ion beam irradiating apparatus of the invention. The ion beam irradiating apparatus is configured so that a target 4 held by a holder 6 is irradiated with an ion beam 2 extracted from an ion source 1 to perform a process such as ion implantation on the target 4. The holder 6 is at, for example, the ground potential. The transporting path of the ion beam 2, and the holder 6 are placed in a vacuum chamber which is not shown, to be in a vacuum atmosphere. For example, the target 4 is a semiconductor substrate, a glass substrate, or the like.

In the transporting path of the ion beam 2 extending from the ion source 1 to the holder 6, as required, a mass separator which separates the mass of the ion beam 2, a scanner which performs a scanning operation on the ion beam 2, and the like are disposed.

Field emission electron sources 10 which emit electrons 12 are disposed in the vicinity of the path of the ion beam 2. In the embodiment, the field emission electron sources 10 are placed in a direction along which the electrons 12 are emitted toward the downstream side of the traveling direction X of the ion beam 2. The field emission electron sources 10 are on the both sides (both sides in the Z direction) of the path of the ion beam 2.

Figure 2:
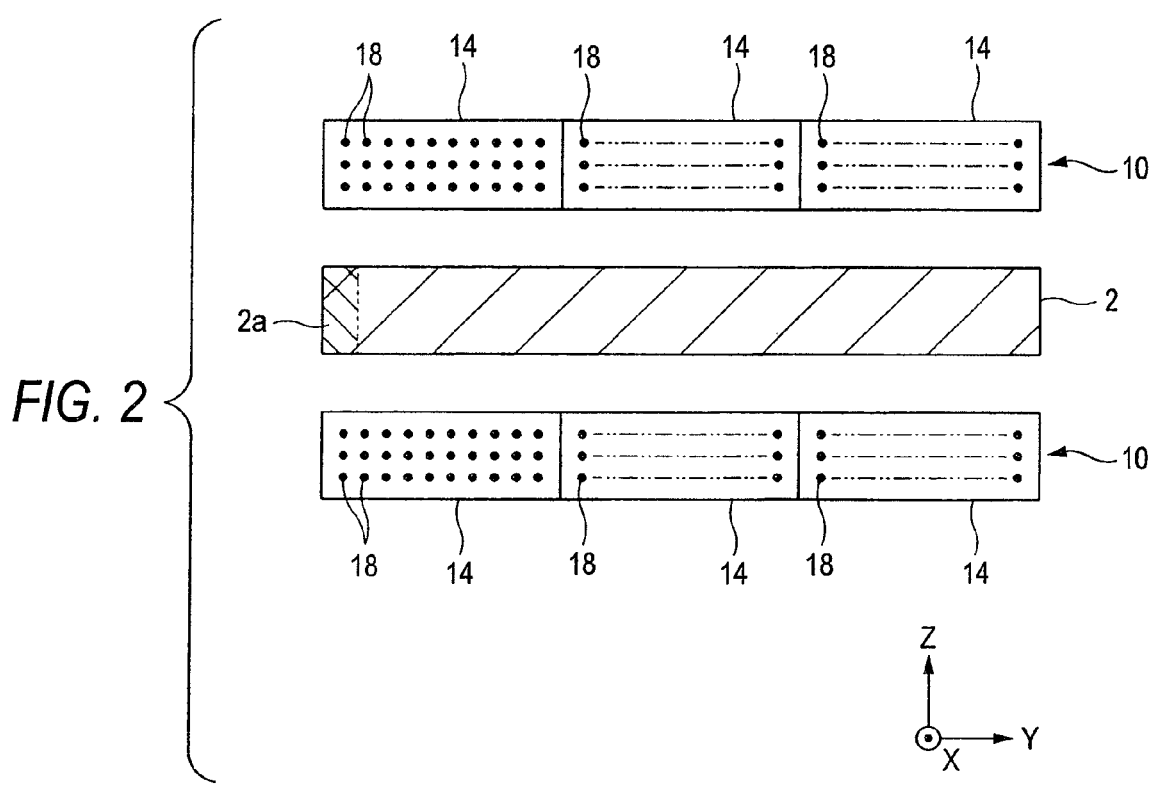
FIG. 2 is a front view showing an example of a field emission electron source and ion beam shown in FIG. 1, as seen from the line A-A.

At the positions of the field emission electron sources 10, the ion beam 2 may have a spot-like section shape, or a so-called ribbon like (this is called also a sheet-like or a strip-like) shape in which, as in an example shown in FIG. 2, the dimension of the Y direction in a plane intersecting with the traveling direction X of the ion beam 2 is larger (specifically, sufficiently larger) than that of the Z direction intersecting with the Y direction. The ribbon-like shape does not mean a shape which is paper-thin.

The ribbon-like ion beam 2 may be caused to have a ribbon-like shape by reciprocally scanning a spot-like ion beam 2a such as shown in FIG. 2 in the Y direction, or may have a ribbon-like shape in a state where the ion beam is extracted from the ion source 1 without performing scanning.

In the embodiment, the target 4 is reciprocally driven together with the holder 6 in a mechanical manner by a target driving apparatus 8 in a direction intersecting with the Y direction (i.e., a direction along the Z direction, or that inclined therefrom). The width in the Y direction of the ion beam 2 is slightly larger than that in the same direction of the target 4. This and the above-described reciprocal driving enable the whole face of the target 4 to be irradiated with the ion beam 2.

The Y direction may be the horizontal direction, the vertical direction, or a direction inclined therefrom.

Figure 3:
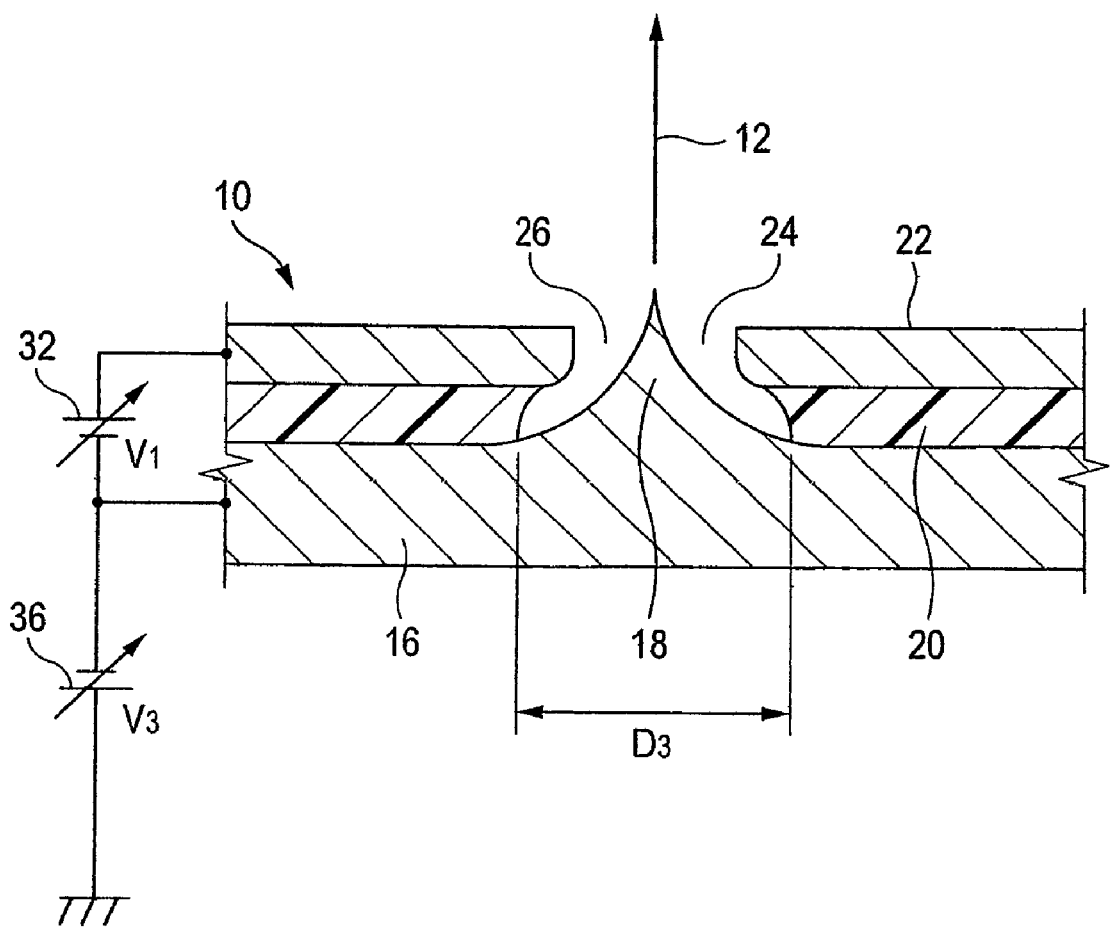
FIG. 3 is a diagram enlargedly showing the vicinity of one emitter of a field emission electron source of a one-extraction electrode type, together with an example of a power source.

As shown in FIG. 3 which enlargedly shows a part of the field emission electron source 10, the electron source 10 comprises: a conductive cathode substrate 16; many minute emitters 18 which are formed in the surface of the cathode substrate 16, and which have a pointed shape; an extraction electrode (also called a gate electrode) 22 which surrounds vicinities of the tip ends of the emitters 18 with forming minute gaps 26 therebetween, and which is common to the emitters 18; and an insulating layer 20 which is disposed between the extraction electrode 22 and the cathode substrate 16 to insulate them from each other. The cathode substrate 16 and the emitters 18 are electrically conductive with one another.

Each of the emitters 18 has a sharp pointed-shape. In other words, the emitter has a shape which is more pointed as further advancing toward the tip end. In the example shown in FIG. 3, the emitters have a conical shape, or alternatively may have a pyramidal shape or the like.

The extraction electrode 22 has minute holes 24 at positions corresponding to the emitters 18. Each of the minute holes 24 has, for example, a circular shape. At a center portion of the minute hole 24, a vicinity of the tip end of the corresponding emitter 18 is positioned with forming the minute gap 26 between the emitter 18 and the inner wall of the minute hole 24.

The height of each of the emitters 18, the diameter $D_3$ of a basal portion, the diameter of each of the minute holes 24, and the diameter of each of the gaps 26 have a minute size in unit of μm.

The thus configured emitters 18 are formed in a large number on the cathode substrate 16. The large number is not a number of several tens to several hundreds, but simply speaking is at least about ten thousand or more. Specifically, as shown in FIG. 2, each of the field emission electron sources 10 in the embodiment has plural electron source arrays 14, and each of the electron source 10 arrays 14 has about ten to twenty thousand emitters 18. The number of the electron source 10 arrays 14 constituting each field emission electron source 10 is not restricted to three shown in FIG. 2.

Referring again to FIG. 3, a DC extraction power source 32 which applies an extraction voltage $V_1$ for extracting the electrons 12 from the emitters 18 by means of field emission is connected between the cathode substrate 16 of the field emission electron source 10 and the extraction electrode 22, while setting the extraction electrode 22 to the positive side. For example, the extraction voltage $V_1$ is about 50 to 100 V.

As required, as shown in the example of FIG. 3, an energy adjusting power source 36 which adjusts the energy of the electrons 12 to be emitted from the field emission electron source 10 may be connected between the cathode substrate 16 and the ground potential. For example, the output voltage $V_3$ of the power source is about 0 to 50 V.

The field emission electron source 10 can emit the electrons 12 at the extraction voltage $V_1$ which is low as described above, and hence can emit the electrons 12 of a low energy. Moreover, the electron source 10 has the many emitters 18, and therefore can generate a large amount of electrons 12. For example, one electron source array 14 can generate electrons 12 of about 100 μA to 1 mA. When the electron source 10 is provided with plural electron source arrays 14, the electron source 10 can generate electrons 12 of an integer multiple of the number of the arrays.

The field emission electron source 10 has a structure similar to that of a semiconductor device, and hence can be extremely miniaturized. Moreover, the electron source 10 can be operated while being placed in a vacuum chamber which maintains the path of the ion beam 2 to a vacuum atmosphere. Therefore, the field emission electron source 10 can be placed very close to the path of the ion beam 2.

Figure 4:
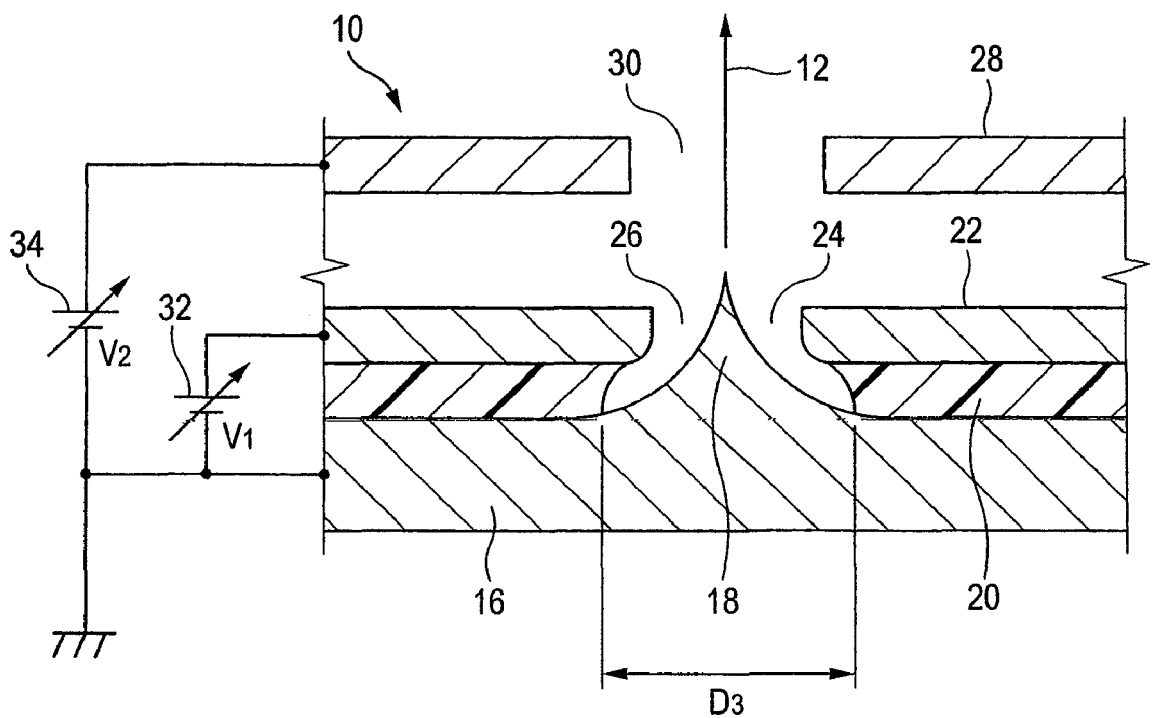
FIG. 4 is a diagram enlargedly showing the vicinity of one emitter of a field emission electron source of a two-extraction electrode type, together with an example of a power source.

As in an example shown in FIG. 4, the field emission electron source 10 may further comprise a second extraction electrode 28 which is on the side of the emission side of the electrons 12 with respect to the extraction electrode 22, which extends along the extraction electrode 22, and which has many minute holes 30. The extraction electrodes 22, 28 are electrically insulated from each other via a space or an insulating layer or the like which is not shown. A DC second extraction power source 34 which applies a second extraction voltage $V_2$ for adjusting the energy of the electrons 12 to be emitted from the field emission electron source 10 is connected between the cathode substrate 16 and the second extraction electrode 28. When $V_2 > V_1$, the electron source 10 is operated in an acceleration mode in which the energy of the emitted electrons 12 is further increased, and, when $V_2 < V_1$, the electron source 10 is operated in a deceleration mode in which the energy of the emitted electrons 12 is further decreased.

Figure 5:
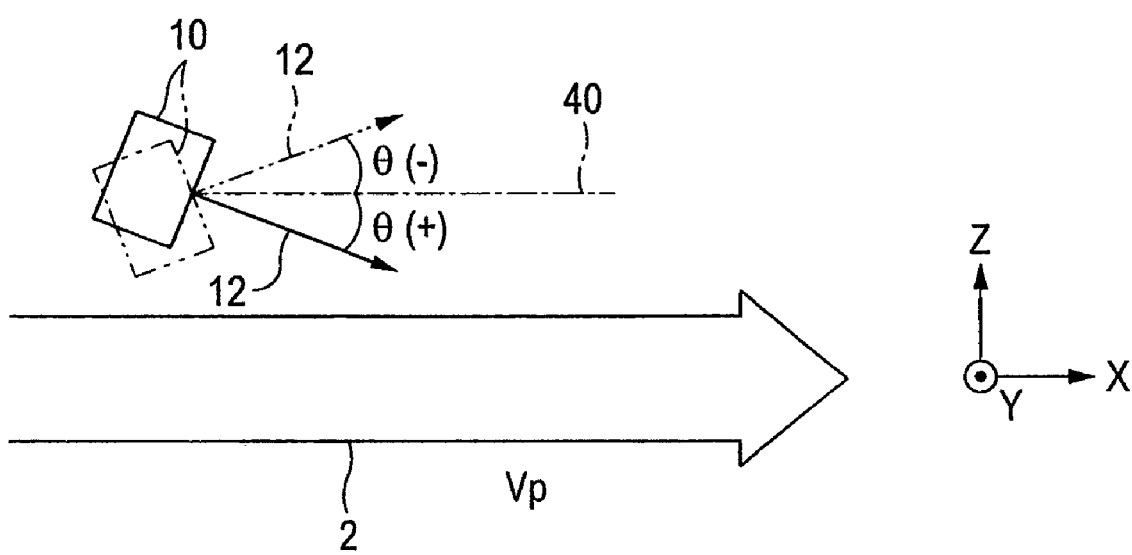
FIG. 5 is a diagram illustrating an incident angle of electrons emitted from the field emission electron source, with respect to the ion beam.

As shown in FIG. 5, an angle θ of the electrons 12 emitted from the field emission electron source 10 with respect to a direction 40 which is parallel to the traveling direction X of the ion beam 2 is called an incident angle. The incident angle θ is set while the inward direction of the ion beam 2 is + (positive), and the outward direction is − (negative).

The field emission electron source disclosed in Patent Reference 1 is placed in a direction along which the incident angle θ is about 90 deg. By contrast, in the embodiment, the field emission electron sources 10 are placed in a direction along which the incident angle θ is, for example, in a range from about −15 deg. to +45 deg.

The field emission electron sources 10 can be placed in a direction of the incident angle θ which is sufficiently smaller than 90 deg. as described above because of the following reason. As described above, the field emission electron sources 10 can be extremely miniaturized, and operated in a vacuum atmosphere. Therefore, the field emission electron sources 10 can be placed very close to the path of the ion beam 2.

Even when the electrons 12 are emitted from the field emission electron sources 10 at the above-described small incident angle θ, a positive beam potential $V_p$ produced by the ion beam 2 exists in the ion beam 2 and in the periphery thereof. Accordingly, the electrons 12 are pulled into the ion beam 2 by the beam potential $V_p$ to contribute to the neutralization of space charge of the ion beam 2.

Furthermore, when the incident angle θ of the electrons 12 at the emission from the field emission electron sources 10 is set within the above-described range, the possibility that the electrons 12 are moved so as to pass through the ion beam 2 or stride over the ion beam 2 is lowered, and therefore the existence probability of the electrons 12 in the ion beam 2 is increased. As a result, space charge of the ion beam 2 can be efficiently neutralized and dispersion of the ion beam 2 due to the space charge can be effectively suppressed. Therefore, the transport efficiency of the ion beam 2 can be improved.

Results of simulations of the relationship between the incident angle θ of the electrons 12, and the neutralization of the ion beam 2, i.e., suppression of dispersion will be described.

Figure 7:
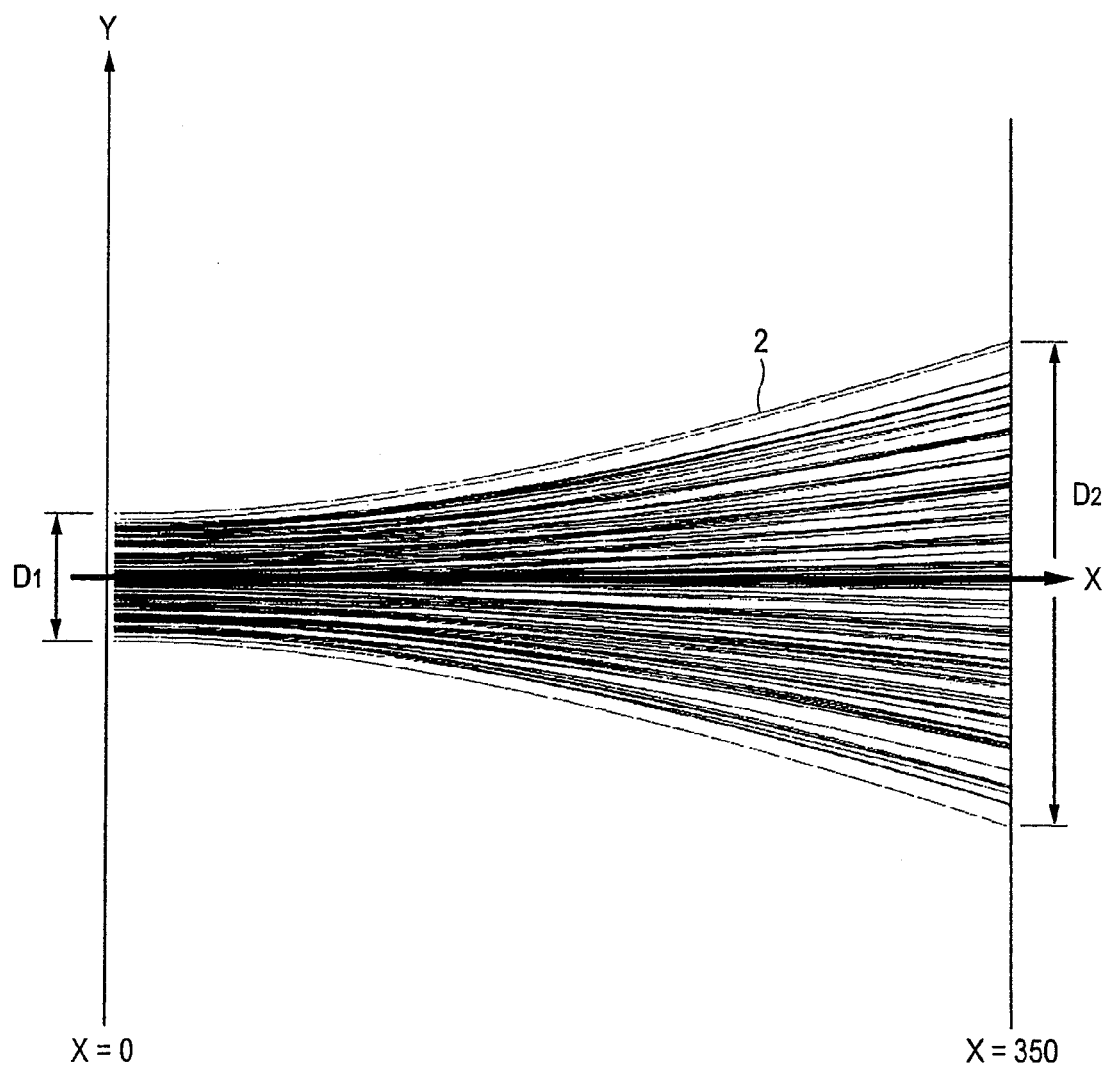
FIG. 7 is a view showing an example of results of simulations of dispersion of the ion beam due to space charge in the case where electrons were not supplied.

FIG. 7 shows an example of dispersion of the ion beam 2 due to space charge in the case where the electrons 12 were not supplied. In the following simulations, ion species of the ion beam 2 were $^{31}P^+$, the energy was 500 eV, the current was 25 μA, and the diameter $D_1$ at the position of X=0 mm was 50 mm. When the electrons 12 were not supplied, the diameter $D_2$ of the ion beam 2 at the position of X=350 mm is 193 mm, and it is seen that the ion beam is largely dispersed.

Figure 8:
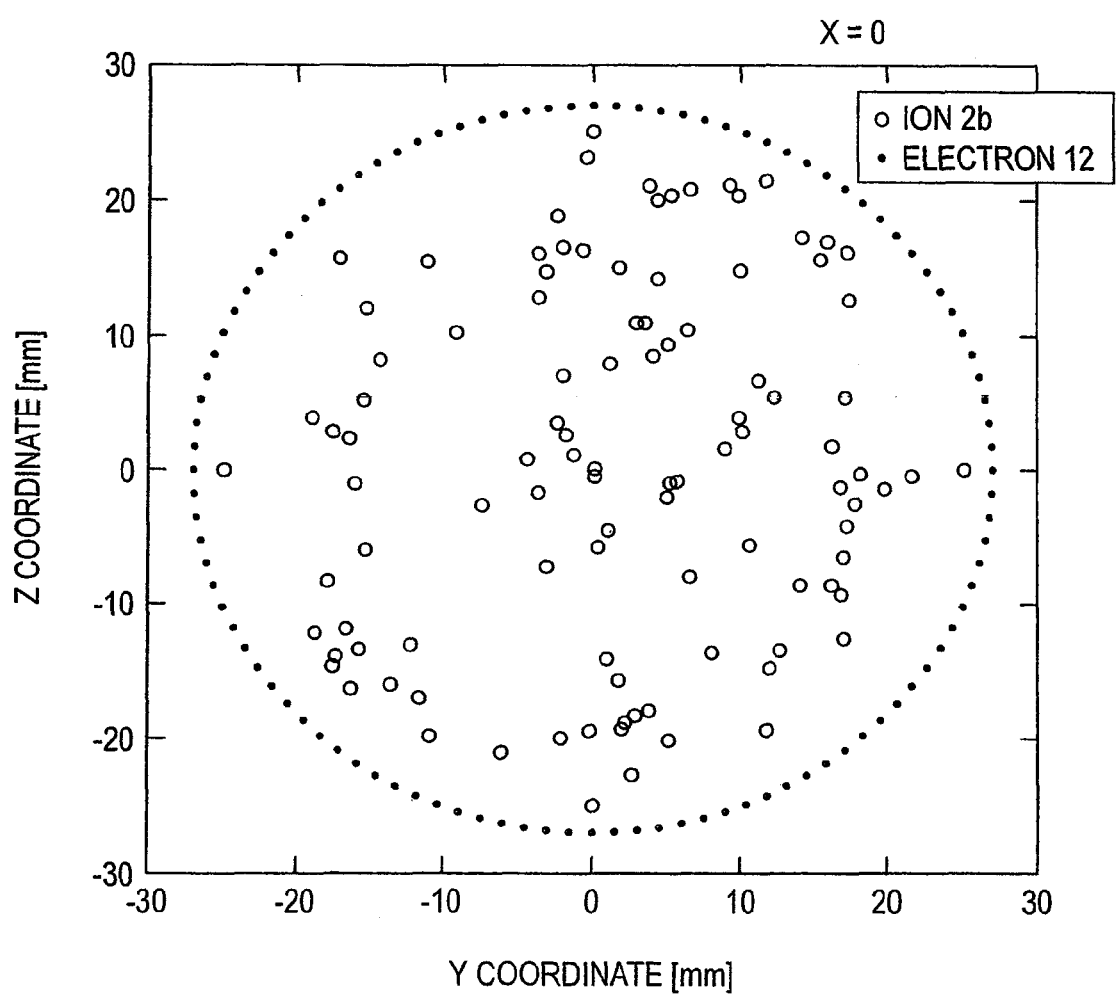
FIG. 8 is a view showing initial conditions of simulations of neutralizing the ion beam while supplying electrons.

FIG. 8 shows initial conditions of simulations of neutralizing the ion beam 2 while supplying the electrons 12. At the position of X=0 mm, ions 2b constituting the ion beam 2 were dispersedly placed in the YZ plane, and the electrons 12 were circularly placed in the periphery. The electrons 12 were emitted at various incident angles θ. At this time, the energy of the electrons 12 was 10 eV, and a ratio $I_e/I_i$ of an electron current $I_e$ to an ion beam current $I_i$ was 34.

Figure 9:
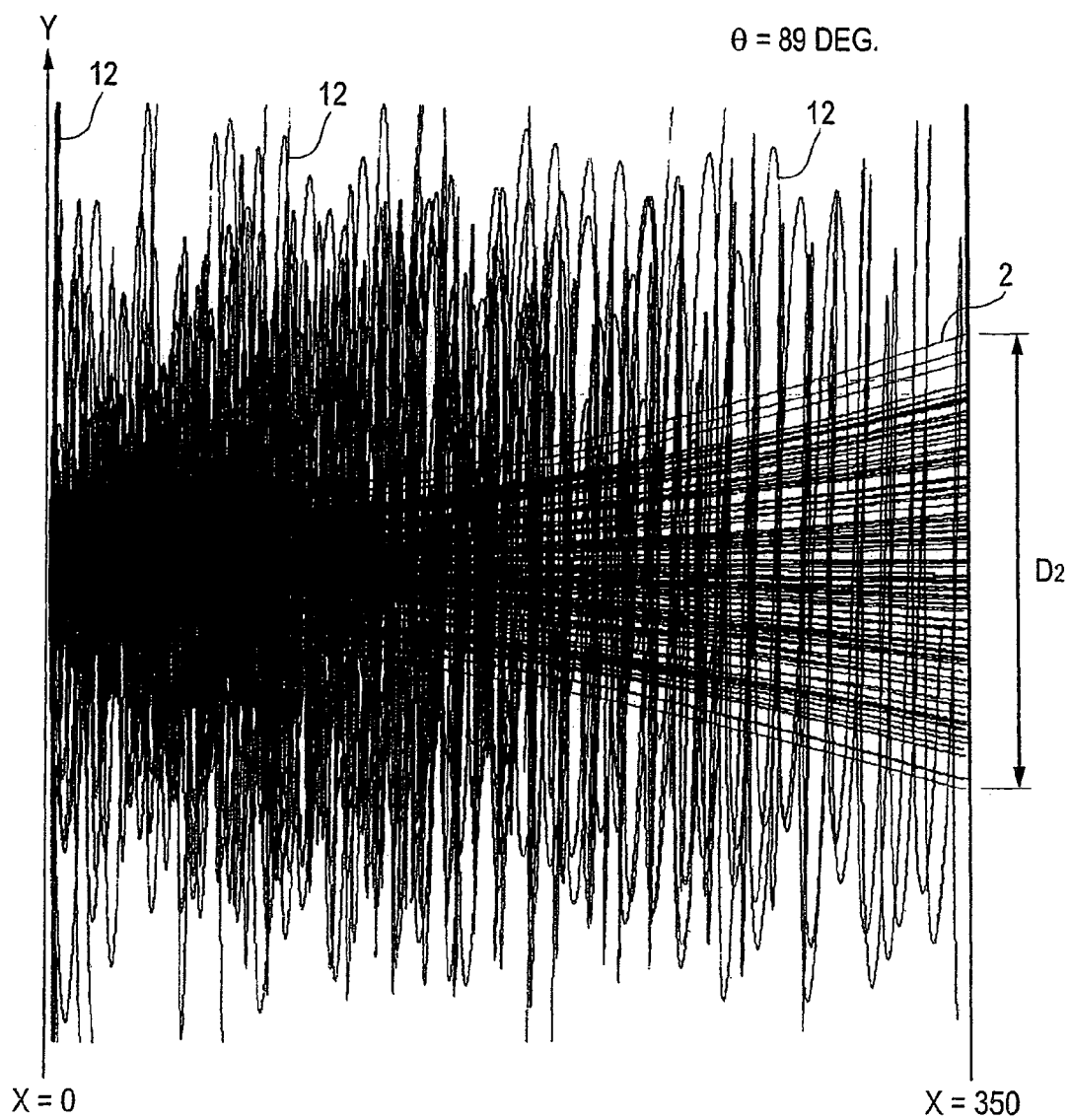
FIG. 9 is a view showing an example of results of simulations of electron orbits and dispersion of the ion beam in the case where electrons were supplied to the ion beam at an incident angle of 89 deg.

FIG. 9 shows an example of the case where the incident angle θ is 89 deg. This example is similar to the arrangement of the field emission electron source disclosed in Patent Reference 1. It is seen that the electrons 12 pass through the ion beam 2 many times to reciprocally vibrate. The diameter $D_2$ of the ion beam 2 at the position of X=350 mm is 186 mm, and it is seen that the ion beam 2 is largely dispersed and the electrons 12 hardly contribute to the neutralization of space charge of the ion beam 2.

Figure 10:
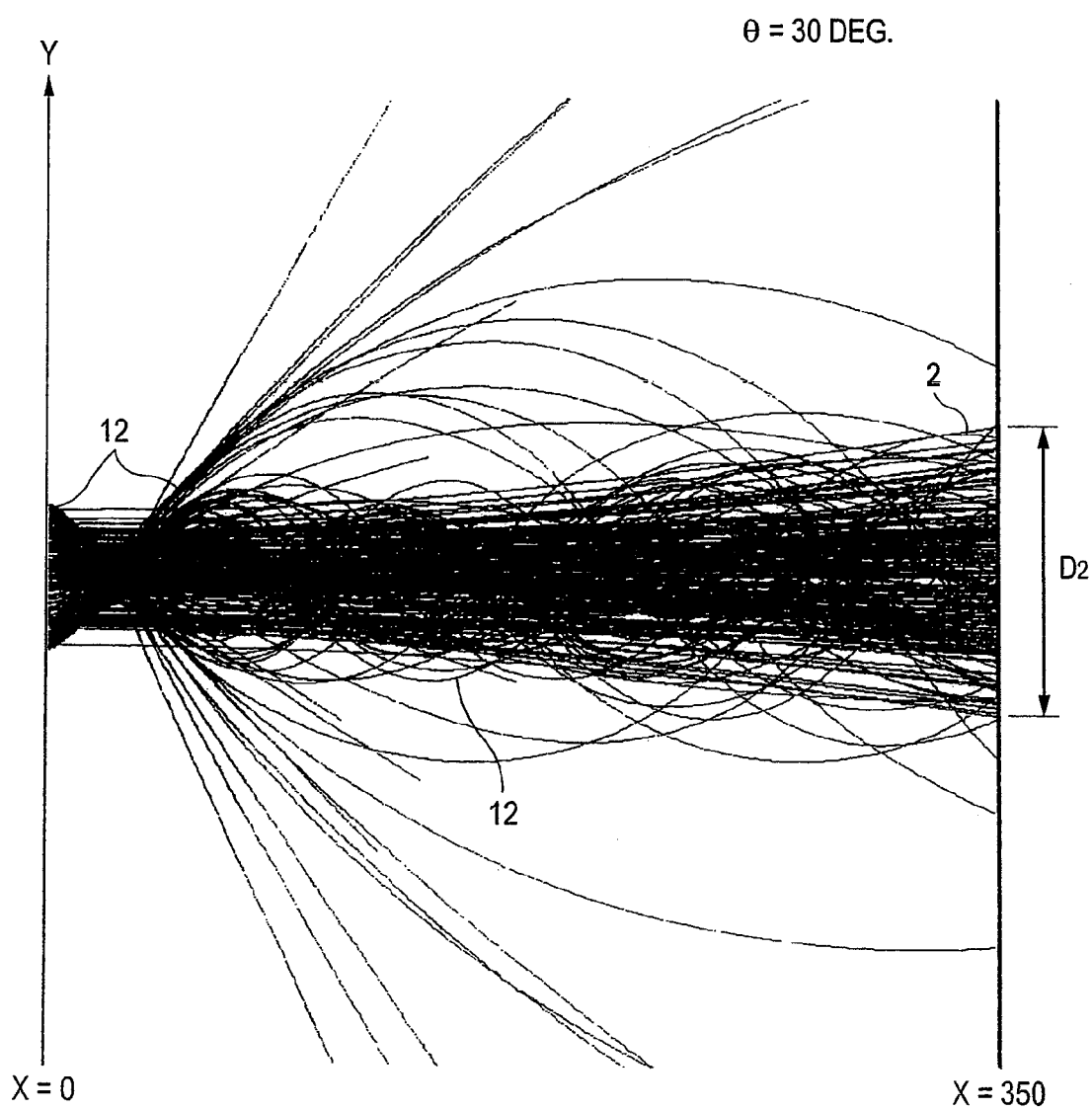
FIG. 10 is a view showing an example of results of simulations of electron orbits and dispersion of the ion beam in the case where electrons were supplied to the ion beam at an incident angle of 30 deg.

FIG. 10 shows an example of the case where the incident angle θ is 30 deg. It is seen that most of the electrons 12 are captured into orbits of the ion beam 2. The diameter $D_2$ of the ion beam 2 at the position of X=350 mm is 116 mm, and it is seen that the electrons 12 efficiently contribute to the neutralization of space charge of the ion beam 2, and dispersion of the ion beam 2 is effectively suppressed.

Figure 11:
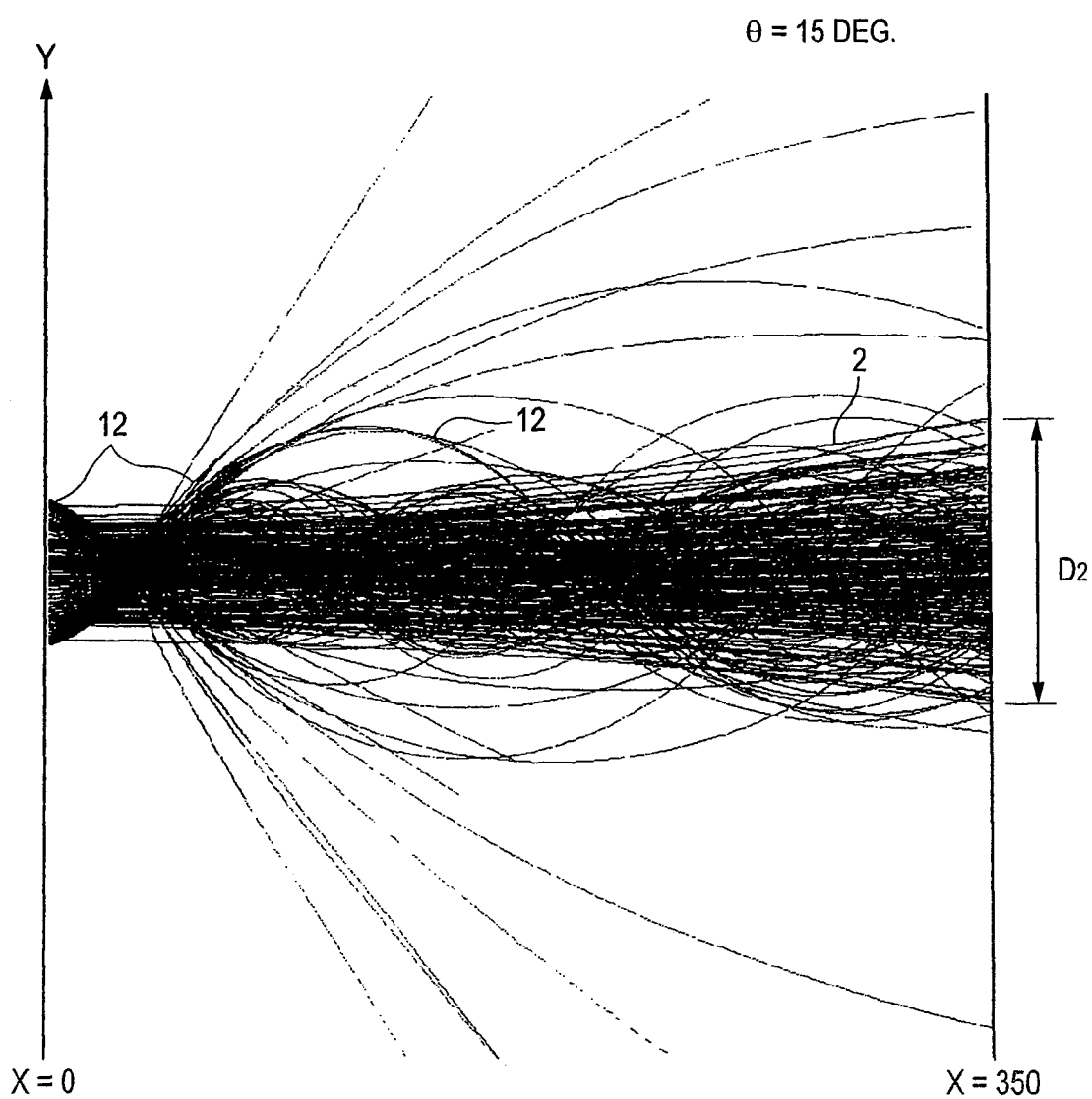
FIG. 11 is a view showing an example of results of simulations of electron orbits and dispersion of the ion beam in the case where electrons were supplied to the ion beam at an incident angle of 15 deg.

FIG. 11 shows an example of the case where the incident angle θ is 15 deg. It is seen that most of the electrons 12 are captured into orbits of the ion beam 2. The diameter $D_2$ of the ion beam 2 at the position of X=350 mm is 113 mm, and it is seen that the electrons 12 more efficiently contribute to the neutralization of space charge of the ion beam 2, and dispersion of the ion beam 2 is more effectively suppressed.

Figure 12:
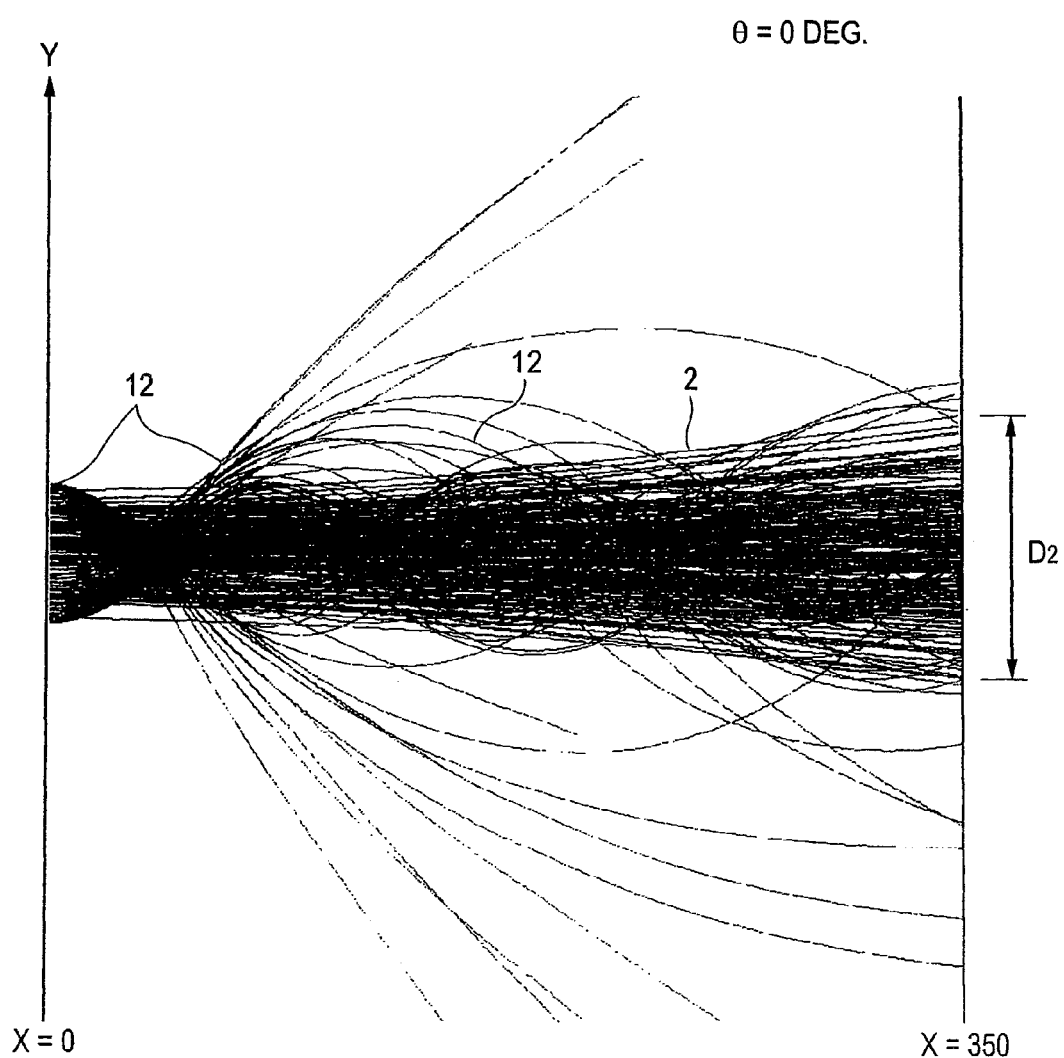
FIG. 12 is a view showing an example of results of simulations of electron orbits and dispersion of the ion beam in the case where electrons were supplied to the ion beam at an incident angle of 0 deg.

FIG. 12 shows an example of the case where the incident angle θ is 0 deg. The diameter $D_2$ of the ion beam 2 at the position of X=350 mm is 111 mm, and it is seen that the electrons 12 further efficiently contribute to the neutralization of space charge of the ion beam 2, and dispersion of the ion beam 2 is further effectively suppressed.

Figure 13:
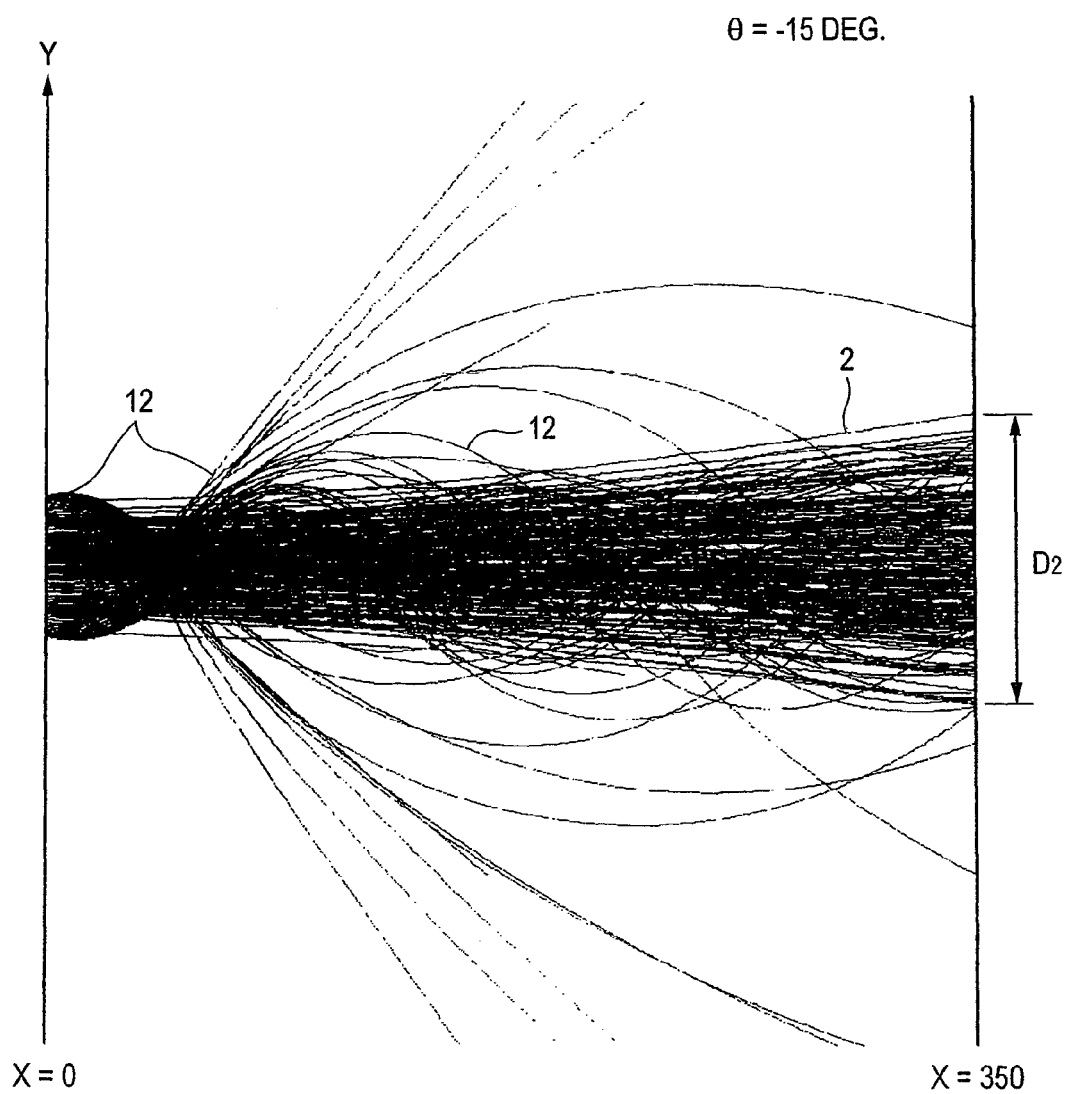
FIG. 13 is a view showing an example of results of simulations of electron orbits and dispersion of the ion beam in the case where electrons were supplied to the ion beam at an incident angle of −15 deg.

FIG. 13 shows an example of the case where the incident angle θ is −15 deg. It is seen that, even in the case where the incident angle θ is negative, when the absolute value of the angle is small as in this example, most of the electrons 12 are captured into orbits of the ion beam 2 by the positive beam potential of the ion beam 2. The diameter $D_2$ of the ion beam 2 at the position of X=350 mm is 120 mm, and it is seen that the electrons 12 efficiently contribute to the neutralization of space charge of the ion beam 2, and dispersion of the ion beam 2 is effectively suppressed.

Figure 14:
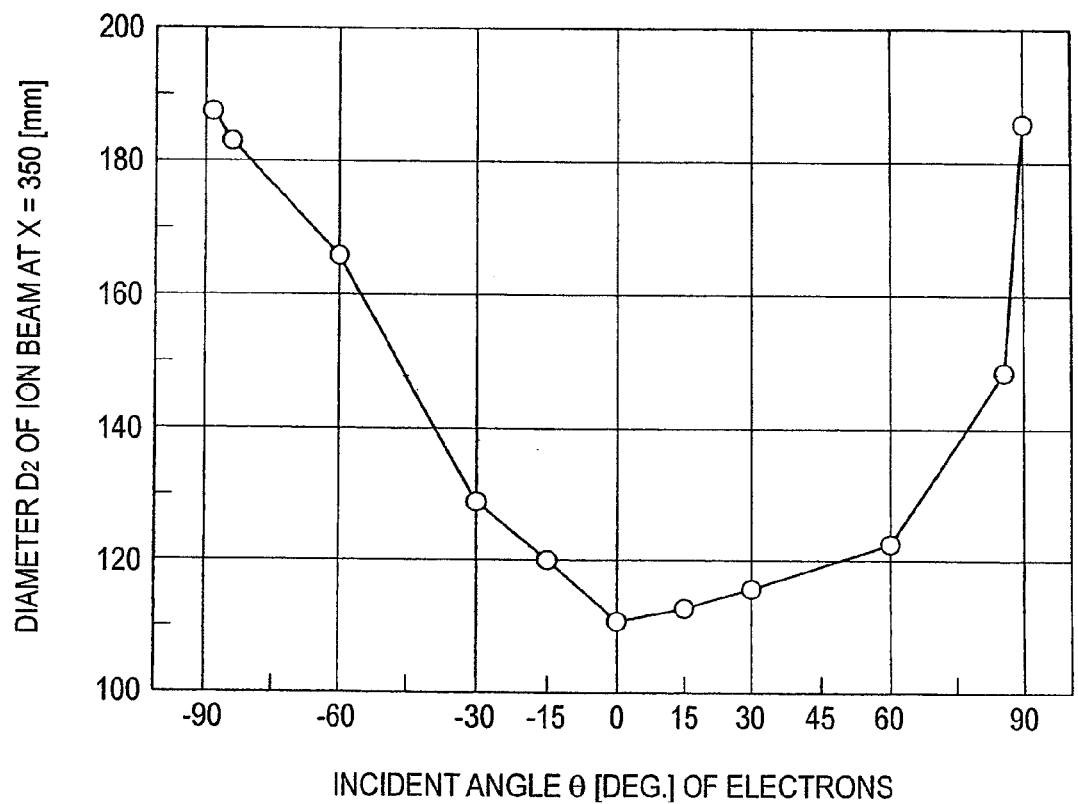
FIG. 14 is a view collectively showing the diameter of the ion beam at a position of X=350 mm with respect to the incident angle of electrons.

Simulations at the incident angle θ other than the above values were performed. FIG. 14 collectively shows the diameter $D_2$ of the ion beam 2 at the position of X=350 mm in the simulations with respect to the incident angle θ of the electrons 12. It is believed that, when the incident angle θ is made large in the negative side, dispersion of the ion beam 2 is increased because of the following reason. The electrons 12 are emitted in a direction separating from the ion beam 2, and hardly captured by the positive beam potential of the ion beam 2. As seen from the figure, preferably, the incident angle θ is in the range from −15 deg. to +45 deg., more preferably, in the range from −15 deg. to +30 deg., further preferably, in the range from substantially 0 deg. to +15 deg., and, most preferably, at substantially 0 deg.

In the above simulations, the electrons 12 are emitted from the periphery of the ion beam 2. By contrast, in the embodiment of FIG. 1, the electrons 12 are emitted from the both sides of the ion beam 2, i.e., from the field emission electron sources 10 placed on the both sides of the ion beam 2. Although the conditions are slightly different as described above, the simulations and the embodiment are common in that the electrons 12 are emitted from the vicinity of the ion beam 2. From the results of the simulations, therefore, it is deduced that, also in the embodiment, results having the same tendency as the simulations are obtained by setting the incident angle θ of the electrons 12 emitted from the field emission electron sources 10 to the above-mentioned range.

Namely, the field emission electron sources 10 are preferably placed in a direction along which the incident angle θ of the electrons 12 emitted therefrom is in the range from −15 deg. to +45 deg., more preferably, in the range from −15 deg. to +30 deg., further preferably, in the range from substantially 0 deg. to +15 deg., and, most preferably, at substantially 0 deg. As the incident angle θ is made smaller, dispersion of the ion beam due 2 to the space charge can be more effectively suppressed, and the transport efficiency of the ion beam 2 can be more improved.

Referring again to FIG. 1, the field emission electron sources 10 may be placed in any portion of the path of the ion beam 2 extending from the ion source 1 to the holder 6. When an apparatus for applying an electric or magnetic field to the ion beam 2 exists in the ion beam 2, the electrons 12 hardly pass through the apparatus. Therefore, the electron sources 10 are preferably placed between such an apparatus and a place where dispersion of the ion beam 2 is to be suppressed, for example, on the downstream side of such an apparatus. The field emission electron source 10 may be disposed in plural places of the path of the ion beam 2 extending from the ion source 1 to the holder 6.

As in the embodiment shown in FIG. 1, the field emission electron sources 10 are placed with being directed toward the downstream side, whereby the field emission electron sources 10 are placed so as to be separated from the target 4 toward the upstream side, and dispersion of the ion beam 2 can be effectively suppressed over a long distance to the target 4.

The field emission electron source 10 may be placed on one side of the path of the ion beam 2. As in the embodiment shown in FIGS. 1 and 2, for example, the field emission electron source 10 may be preferably placed on the both sides of the path of the ion beam 2. According to the configuration, the electrons 12 can be supplied to the ion beam 2 from the both sides. Therefore, space charge of the ion beam 2 can be more efficiently neutralized and dispersion of the ion beam 2 due to the space charge can be more effectively suppressed. As required, the field emission electron source 10 may be placed in four places surrounding the path of the ion beam 2. This configuration is more similar to the above-described simulations.

In the case where the ion beam 2 has a ribbon-like shape as in the example shown in FIG. 2, the field emission electron sources 10 preferably have an elongated shape which extends in the Y direction, i.e., the width direction of the ribbon-like shape ion beam 2. According to the configuration, even when the ion beam 2 has a shape which extends in the Y direction, space charge of the ion beam 2 can be neutralized more uniformly over a wider range of the ion beam 2.

Figure 6:
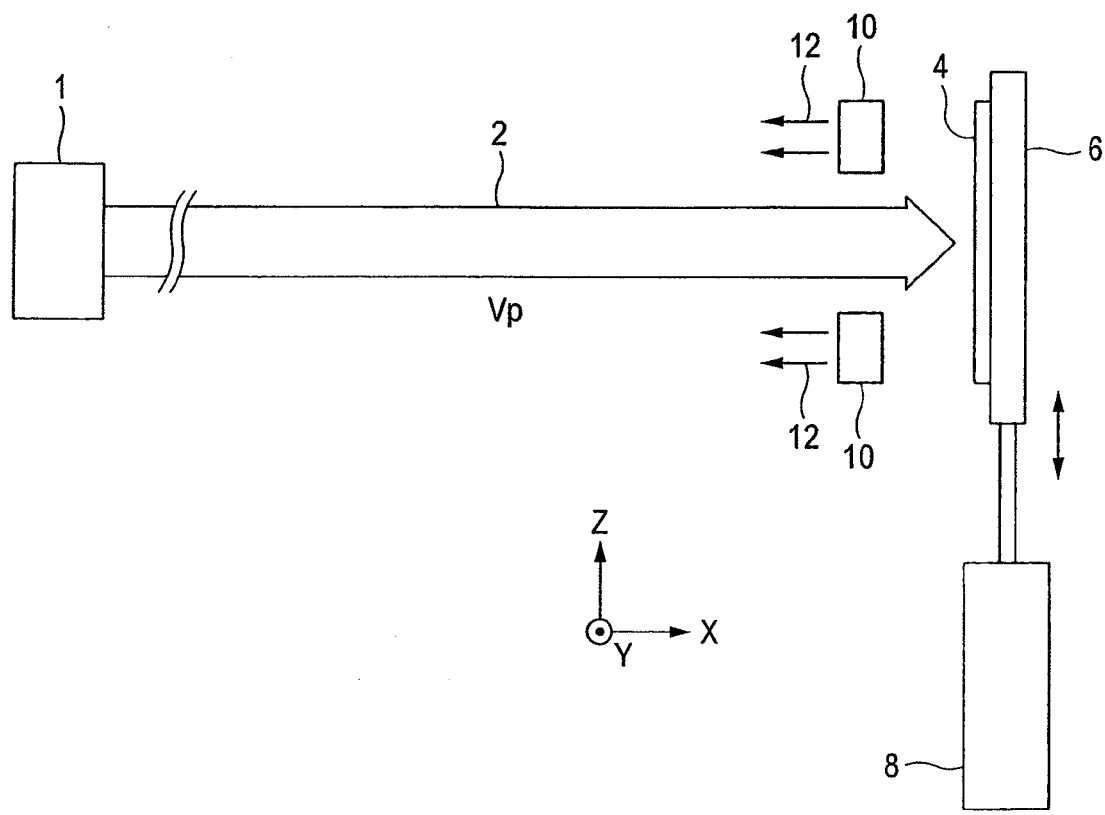
FIG. 6 is a schematic side view showing another embodiment of the ion beam irradiating apparatus of the invention.

As in an embodiment shown in FIG. 6, the field emission electron sources 10 may be placed in a direction along which the electrons 12 are emitted toward the upstream side of the ion beam 2. In this case, preferably, the field emission electron sources 10 may be placed in the vicinity of the upstream side of the holder 6. The other configuration is identical with that of the above-described embodiment, and therefore duplicated description is omitted.

Even when the field emission electron sources 10 are placed with being directed toward the upstream side, the electrons 12 emitted therefrom are captured by the positive beam potential $V_p$ of the ion beam 2 while moving toward the upstream side. By the same function as that of the above-described embodiment in which the field emission electron sources 10 are placed with being directed toward the downstream side, therefore, space charge of the ion beam 2 can be efficiently neutralized and dispersion of the ion beam 2 due to the space charge can be effectively suppressed.

When the field emission electron sources 10 are placed with being directed toward the upstream side, the electrons 12 emitted from the field emission electron sources 10 are hardly incident on the target 4. Therefore, it is possible to suppress negative charging of the surface of the target 4 which is produced by incidence of the electrons 12 on the target 4. This is particularly effective in the case where the energy of the electrons 12 emitted from the field emission electron sources 10 is not very low.

Plural semiconductor devices may be produced on a semiconductor substrate (for example, a silicon substrate) by using the semiconductor substrate as the target 4, using the ion beam irradiating apparatus of one of the embodiments, and irradiating the semiconductor substrate with the ion beam 2. For example, the ion beam irradiating apparatus of one of the embodiments may be used in a step of implanting desired ions (for example, ions serving as impurities) into a desired region of the surface or surface layer portion of the semiconductor substrate, thereby producing plural integrated circuits (for example, system LSIs, or the like) serving as semiconductor devices on the semiconductor substrate.

Recently, miniaturization of semiconductor devices formed on a semiconductor substrate is being extremely advanced (in other words, very highly integrated). When ion implantation is performed on such semiconductor devices, there is a problem of preventing formation of a portion into which ions are not implanted, or a shadowed portion, in a groove or convex portion formed in the surface of the semiconductor substrate. When the prevention is not performed, characteristics of semiconductor devices to be formed are dispersed, and a defect device may be produced.

In order to solve the problem, the semiconductor substrate must be irradiated with an ion beam of high parallelism. When dispersion of the ion beam due to space charge is large, it is difficult to irradiate the semiconductor substrate with an ion beam of high parallelism. By contrast, when the ion beam irradiating apparatus of one of the embodiments is employed, plural semiconductor devices can be produced on a semiconductor substrate by using the ion beam 2 in which space charge is neutralized, and which is less dispersed. Therefore, plural semiconductor devices having uniform characteristics can be produced on the same semiconductor substrate. As a result, the yield is improved, and the production efficiency of a semiconductor device is enhanced.

While the invention has been described in detail with reference to the specific embodiment, it will be obvious to those skilled in the art that various changes and modifications can be made without departing from the spirit and the scope of the invention.

This application is based on Japanese Patent Application (No. 2006-162394) filed on Jun. 12, 2006, which is incorporated herein by reference.

The invention claimed is:

1. An ion beam irradiating apparatus which irradiates a target with an ion beam extracted from an ion source, said apparatus comprising:
    a field emission electron source, which is disposed in a vicinity of a path of the ion beam and which emits electrons to neutralize space charge of the ion beam, said field emission electron source having a conductive cathode substrate, a plurality of minute emitters, which are formed on the conductive cathode substrate and each of which has a pointed shape, and an extraction electrode which surrounds respectively vicinities of tip ends of said emitters with forming a minute gap,
    wherein said field emission electron source is placed in a direction along which an incident angle formed by electrons emitted from said field emission electron source and a direction parallel to a traveling direction of the ion beam is in a range from −15 deg. to +45 deg., where an inward direction of the ion beam is +, and an outward direction is −, and
    wherein said electrons emitted from said field emission electron source directly travel into said path of the ion beam without any deflection members guiding said electrons between said electron source and said path of the ion beam.

2. The ion beam irradiating apparatus according to claim 1, wherein said field emission electron source is placed in a direction along which the incident angle is in a range from −15 deg. to +30 deg.

3. The ion beam irradiating apparatus according to claim 1, wherein said field emission electron source is placed in a direction along which the incident angle is in a range from substantially 0 deg. to +15 deg.

4. The ion beam irradiating apparatus according to claim 1, wherein said field emission electron source is placed in a direction along which the incident angle is substantially 0 deg.

5. The ion beam irradiating apparatus according to claim 1, wherein said field emission electron source is placed in a direction along which electrons are emitted toward a downstream side of the traveling direction of the ion beam.

6. The ion beam irradiating apparatus according to claim 1, wherein said field emission electron source is placed in a direction along which electrons are emitted toward an upstream side of the traveling direction of the ion beam.

7. The ion beam irradiating apparatus according to claim 1, wherein said field emission electron source is placed on both sides of the path of the ion beam.

8. The ion beam irradiating apparatus according to claim 1, wherein, at a position of said field emission electron source, the ion beam has a shape in which a dimension of a Y direction in a plane intersecting with the traveling direction X is larger than a dimension of a Z direction perpendicular to the Y direction, and said field emission electron source has a shape which extends in the Y direction.

9. A method of producing a semiconductor device wherein a semiconductor substrate as a target is irradiated with the ion beam by using an ion beam irradiating apparatus according to claim 1 to perform ion implantation, thereby producing plural semiconductor devices on said semiconductor substrate.

* * * * *